(12) United States Patent
Campbell et al.

(10) Patent No.: US 6,454,899 B1
(45) Date of Patent: Sep. 24, 2002

(54) APPARATUS FOR FILLING TRENCHES

(75) Inventors: William J. Campbell, Austin, TX (US); H. Jim Fulford, Austin, TX (US); Christopher H. Raeder, Austin, TX (US); Craig W. Christian, Buda, TX (US); Thomas Sonderman, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/885,455

(22) Filed: Jun. 19, 2001

Related U.S. Application Data

(62) Division of application No. 09/426,208, filed on Oct. 25, 1999, now Pat. No. 6,284,622.

(51) Int. Cl.⁷ .............................................. H01L 21/00
(52) U.S. Cl. ................... 156/345.24; 156/345.1
(58) Field of Search .................. 156/345.24, 345.31, 156/345.1

(56) References Cited

U.S. PATENT DOCUMENTS

| | | | |
|---|---|---|---|
| 5,590,051 A | 12/1996 | Yokozawa | 364/496 |
| 5,637,351 A | 6/1997 | O'Neal et al. | 427/255.3 |
| 5,724,144 A | 3/1998 | Muller et al. | 356/382 |
| 6,060,370 A | 5/2000 | Hsia et al. | 438/424 |
| 6,306,669 B1 * | 10/2001 | Yano et al. | 438/14 |

* cited by examiner

Primary Examiner—Thi Dang
(74) Attorney, Agent, or Firm—Williams, Morgan & Amerson, P.C.

(57) ABSTRACT

A method for filling a trench is provided. A wafer having at least a first layer formed thereon is provided. A trench is formed in the first layer. The depth of the trench is measured. A target thickness is determined based on the depth of the trench. A second layer of the target thickness is formed over the trench. A processing line includes a trench etch tool, a first metrology tool, a trench fill tool, and an automatic process controller. The trench etch tool is adapted to form a trench in a first layer on a wafer. The first metrology tool is adapted to measure the depth of the trench. The trench fill tool is adapted to form a second layer over the first layer based on an operating recipe. An automatic process controller is adapted to determine a target thickness based on the depth of the trench and modify the operating recipe of the trench fill tool based on the target thickness.

11 Claims, 5 Drawing Sheets

APPARATUS FOR FILLING TRENCHES

This is a divisional of application Ser. No. 09/426,208, filed Oct. 25, 1999, now U.S. Pat. No. 6,284,622.

BACKGROUND OF THE INVENTION

1. Field of the Invention

This invention relates generally to semiconductor manufacturing, and, more particularly, to a method for filling trenches.

2. Description of the Related Art

A conventional integrated circuit device, such as a microprocessor, is typically comprised of many thousands of semiconductor devices, e.g., transistors, formed above the surface of a semiconductive substrate. For the integrated circuit device to function, the transistors must be electrically connected to one another through conductive interconnections. Many modern integrated circuit devices are very densely packed, i.e., there is very little space between the transistors formed above the substrate. Thus, these conductive interconnections must be made in multiple layers to conserve plot space on the semiconductive substrate. One technique for interconnecting devices on the same plane is to form a trench in an insulative layer (e.g., silicon dioxide or silicon nitride) and fill the trench with a conductive material (e.g., metal).

The semiconductor devices that comprise the integrated circuit must also be electrically isolated from one another. A common technique for forming isolation structures, referred to as shallow trench isolation, involves forming a trench in a substrate and filling the trench with an insulative material (e.g., silicon oxide).

Typically, trenches are filled by blanket depositing a layer over the trench topology and removing the portions of the layer outside of the trenches using a chemical mechanical polishing (CMP) technique. A chemical mechanical polishing process planarizes the layer to ease formation of subsequent process layers. Chemical mechanical polishing typically uses an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted. The polishing device may include one or more rotating carrier heads to which wafers may be secured, typically through the use of vacuum pressure. In use, the platen may be rotated and an abrasive slurry may be disbursed onto the polishing pad. Once the slurry has been applied to the polishing pad, a downward force may be applied to each rotating carrier head to press the attached wafer against the polishing pad. As the wafer is pressed against the polishing pad, the surface of the wafer is mechanically and chemically polished.

The deposited layer to be polished initially conforms to the underlying trench topology, leaving low areas (i.e., over the trench) and high areas (i.e., where no trench is present). The CMP process removes the high areas at a higher rate than the low areas, thus planarizing the surface. Due to the flexibility of the polishing pad and the presence of isotropic etchants in the polishing slurry, some etching of the low areas above the trenches occurs. If the thickness of the deposited layer is not sufficient, the low areas may be etched such that a portion of the material within the trench is undesirably removed, thus interfering with the function of the trench (i.e., either as a conductive member or as an isolation structure).

Often, there is no reliable endpoint available for stopping the anisotropic etch used to form the trench, and thus, the trench depth may vary from lot to lot or wafer to wafer. To account for this variation, a worst case trench depth is determined and the deposited layer thickness and polish parameters are selected to address this limiting case. As a result of this worst case approach, often more material is deposited and polished than is actually required for the particular trench depth of the wafer being processed. Such over deposition and over polishing decreases the throughput of the processing line by increasing the processing time required at these steps. Also, due to the flexibility of the polishing pad, it is possible that the high areas may be removed while a portion of the low areas remains extending beyond the trench. In such a case, the polishing pad will begin removing the substrate, albeit at a different rate than the deposited layer. This effect, commonly referred to as dishing the substrate, can have deleterious effects on the semiconductor device and result in it being discarded.

The present invention is directed to overcoming, or at least reducing the effects of, one or more of the problems set forth above.

SUMMARY OF THE INVENTION

One aspect of the present invention is seen in a method for filling a trench. A wafer having at least a first layer formed thereon is provided. A trench is formed in the first layer. The depth of the trench is measured. A target thickness is determined based on the depth of the trench. A second layer of the target thickness is formed over the trench.

Another aspect of the present invention is seen in a processing line including a trench etch tool, a first metrology tool, a trench fill tool, and an automatic process controller. The trench etch tool is adapted to form a trench in a first layer on a wafer. The first metrology tool is adapted to measure the depth of the trench. The trench fill tool is adapted to form a second layer over the first layer based on an operating recipe. An automatic process controller is adapted to determine a target thickness based on the depth of the trench and modify the operating recipe of the trench fill tool based on the target thickness.

BRIEF DESCRIPTION OF THE DRAWINGS

The invention may be understood by reference to the following description taken in conjunction with the accompanying drawings, in which like reference numerals identify like is elements, and in which.

DETAILED DESCRIPTION OF SPECIFIC EMBODIMENTS

Figure 1:
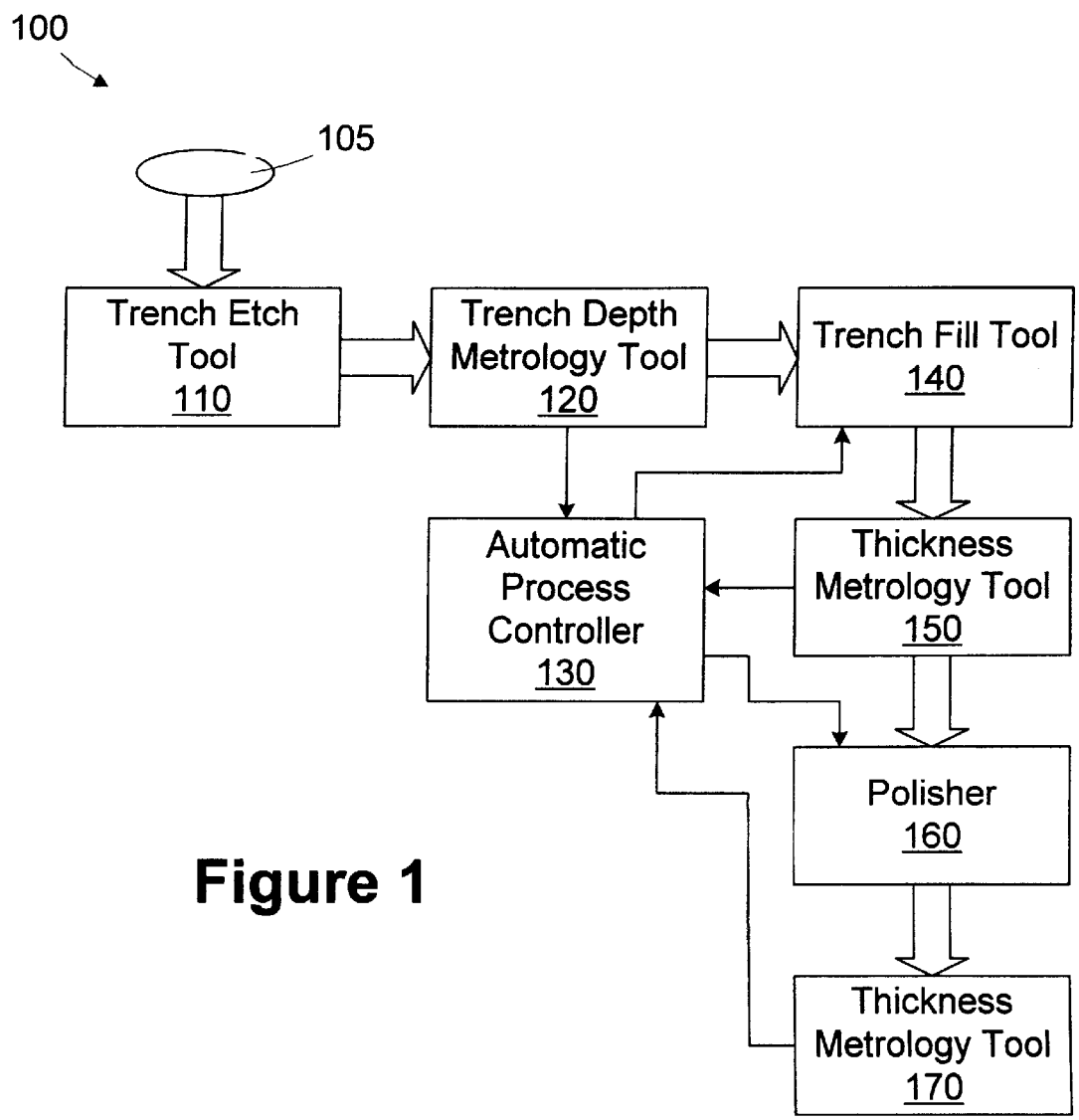
FIG. 1 is a simplified block diagram of a processing line for forming trench based features on a wafer in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the Figures, and particularly to FIG. 1, a simplified block diagram of a processing line 100 useful for forming a trench feature in a wafer 105 is provided. The operation of the processing line 100 of FIG. 1 is described in reference to the cross-section views of the wafer 105 provided in FIGS. 2 through 4. The application of the present invention is described as it may be implemented to form shallow trench isolation (STI) structures. However, it is contemplated that, in light of this disclosure, the invention may also be applied to other trench applications, such as the formation of conductive lines by filling trenches in an oxide layer with a metal.

Figure 2:
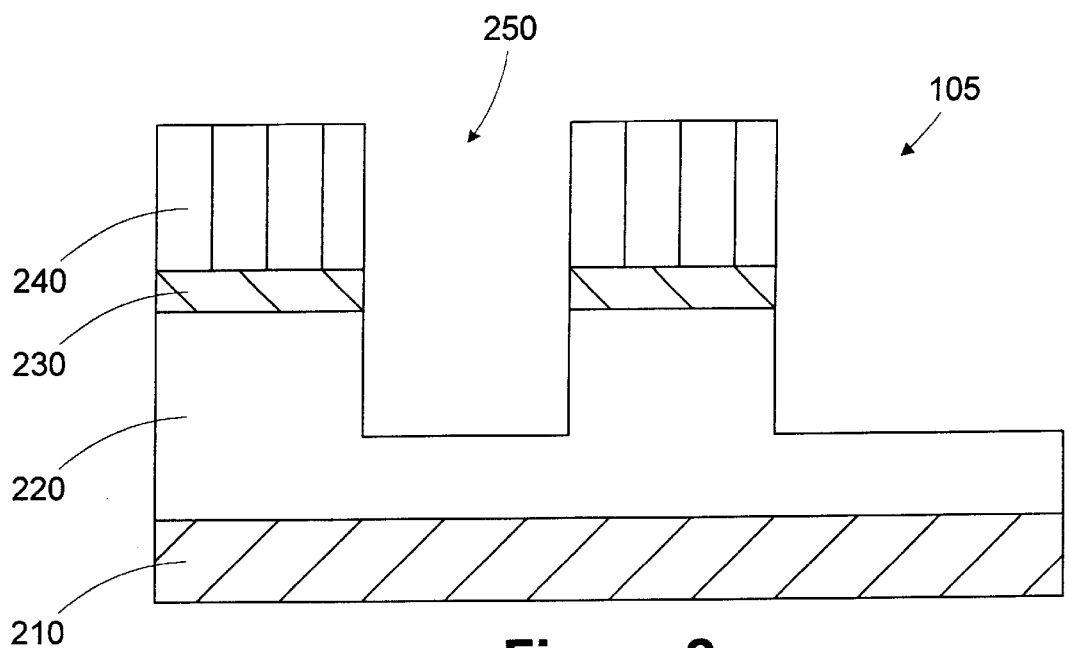
FIG. 2 is a cross-section view of a semiconductor device after a trench has been formed in a base layer.
Figure 3:
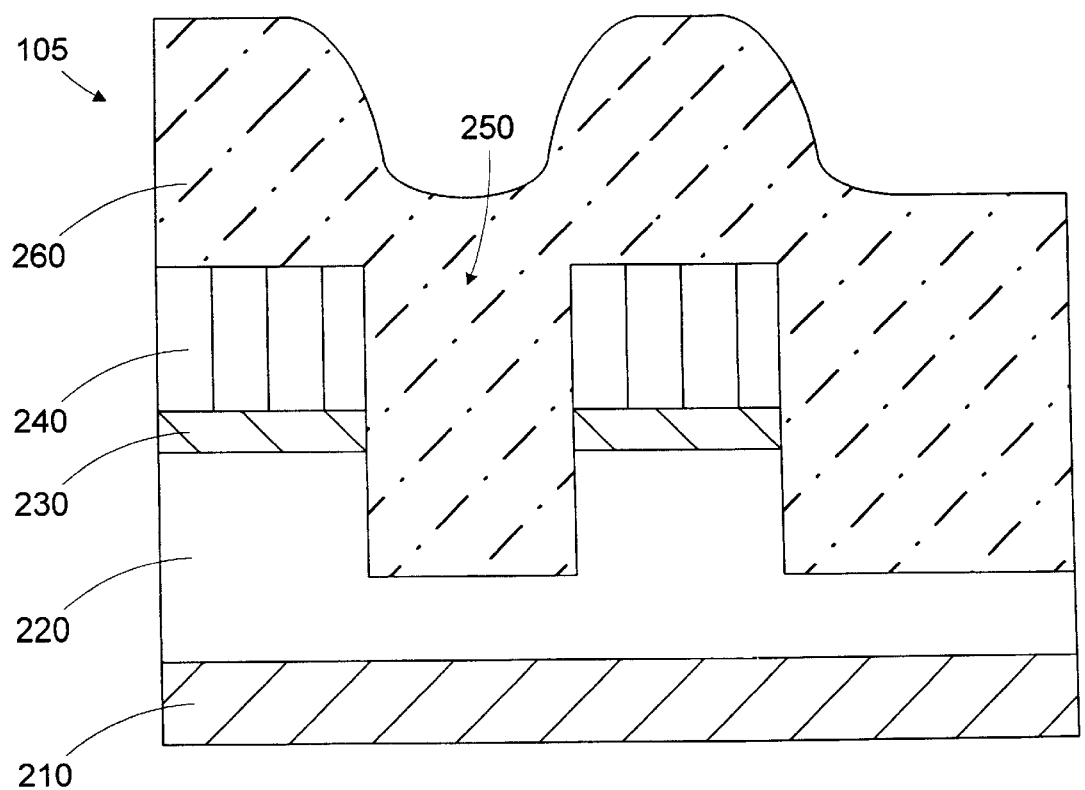
FIG. 3 is a cross-section view of the device of FIG. 2 after a fill layer has been formed over the trench.

As seen in FIG. 2, a substrate 210 (e.g., silicon) is provided. An epitaxial silicon layer 220 is grown over the substrate 210. A barrier oxide layer 230 is formed over the epitaxial silicon layer 220, and a silicon nitride layer 240 is formed over the barrier oxide layer 230. Referring to both FIG. 1 and FIG. 2, a trench etch tool 110 forms a trench 250 through the silicon nitride layer 240, barrier oxide layer 230, and epitaxial silicon layer 220 using processing techniques well known to those of ordinary skill in the art. An exemplary device suitable for forming the trench 250 is an AMAT 5000 etcher offered by Applied Materials, Inc. There is no end point signal available when etching the epitaxial silicon layer 220, and thus, there are variations in the depth of the trench 250 from lot-to-lot or wafer-to-wafer. As stated above, the trench etch tool 110 may also be adapted to etch the trench 250 in an oxide base layer (not shown) if the desired trench feature is a conductive line.

The depth of the trench 250 is measured by a trench depth metrology tool 120. Depending on the specific application, the trench depth metrology tool 120 may measure the depth of the trench 250 on one wafer 105 in a lot, or on each individual wafer 105. Other measurement frequencies may also be used. An exemplary tool suitable for measuring the trench depth is a Tencor P-20 offered by the KLA-Tencor Corporation.

The trench depth measurement is passed to an automatic process controller 130. The automatic process controller 130 may comprise a general computer executing software, a dedicated hardware device, or some other combination of hardware, software, firmware, etc. The automatic process controller 130 may communicate with other devices in the processing line 100 over a communication bus (not shown) such as a computer network (not shown). Based on the trench depth measurement, the automatic process controller 130 modifies the operating recipe of a trench fill tool 140 in accordance with predetermined control equations to affect the thickness of the fill layer subsequently formed to fill the trench 250. In the illustrated embodiment, the fill layer is a silicon dioxide layer 260 (shown in FIG. 3). Again, it is contemplated that if a conductive line is being formed, the trench fill tool 140 may function to fill the trench 250, by deposition or electroplating, with a metal layer (not shown), such as copper, aluminum, aluminum alloys, titanium, tantalum, titanium nitride, tantalum nitride, tungsten, or some other conductive material.

Exemplary control equations for modifying the operating recipe of the trench fill tool 140 to control the thickness of the silicon dioxide layer 260 are:

$$\text{Desired Thickness} = \text{Nominal Layer Thickness} + \text{Controller Gain} * (\text{Trench Depth} - \text{Target Trench Depth}) \quad (1)$$

$$\text{Deposition Time} = \text{Desired Thickness}/\text{Deposition Rate} \quad (2)$$

In the illustrated embodiment, the controller gain is 0.5, although other gains are contemplated. The control equations given by Equations 1 and 2 are merely exemplary. Other control equations, linear or non-linear may be used. There are various recipe parameters that may be changed by the automatic process controller 130 to affect the thickness of the layer formed by the trench fill tool 140, including, but not limited to, deposition time, gas flow rate, process temperature, etc. An exemplary tool suitable for forming the silicon dioxide layer 260 is a TEL Vertical Oven offered by Tokyo Electronics Ltd.

Figure 4:
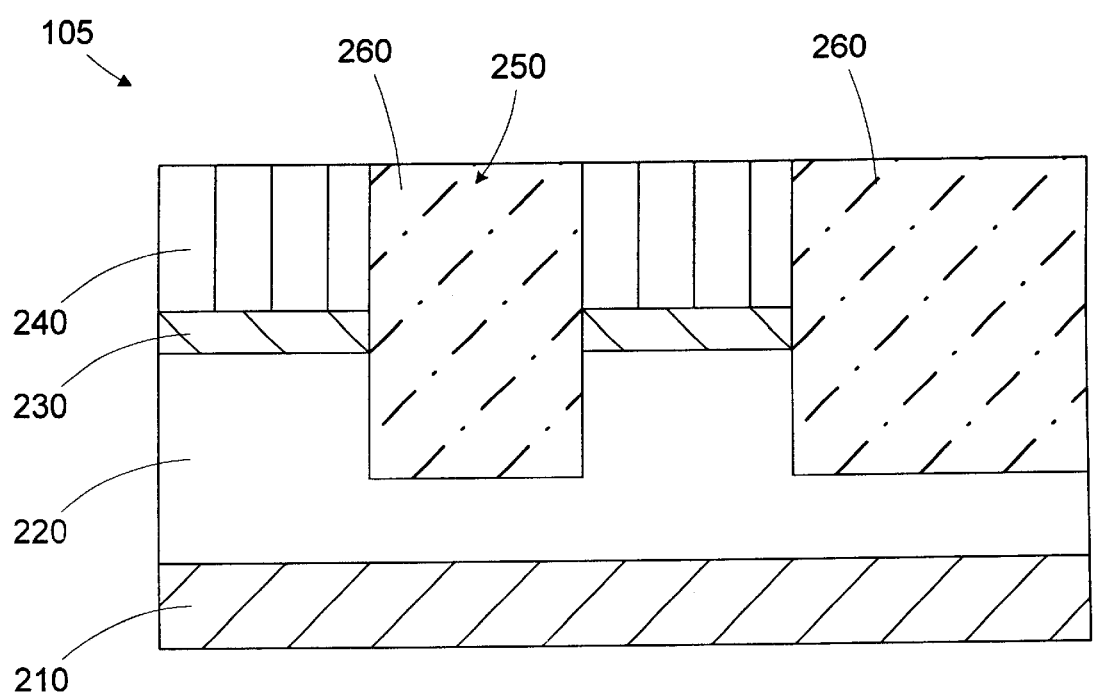
FIG. 4 is a cross-section view of the device of FIG. 3 after the fill layer has been planarized.

A thickness metrology tool 150 (e.g., an Opti-Probe offered by Therma-Wave, Inc.) measure the thickness of the silicon dioxide layer 260 and provides the thickness measurement to the automatic process controller 130. The automatic process controller 130 then modifies the operating recipe of a polisher 160 based on the thickness measurement in accordance with polishing control equations. The polisher 160 planarizes the wafer 105 as shown in FIG. 4.

The automatic process controller 130 may modify the operating recipe of the polisher 160 to change one or more parameters, including, but not limited to, polish time, down force, table speed, slurry delivery rate, arm oscillation radius, etc. to compensate for the thickness of the silicon dioxide layer 260. Exemplary, polishers 160 are an Auriga Polishing System offered by Speedfam International, Inc. or a Teres Polisher offered by Lam research Corporation.

An exemplary polish control equation for changing the polish time based on the thickness of the layer formed by the trench fill tool 140 and measured by the thickness metrology tool 150 is:

$$\text{Polish Time} = \text{Desired Thickness (from Equation 2)}/\text{Polish Rate} \quad (3)$$

It is contemplated that the processing line 100 may be implemented without the thickness metrology tool 150. For example, the automatic process controller 130 may modify the operating recipe of the polisher 160 based on the thickness programmed into the operating recipe of the trench fill tool 140 in lieu of using an actual measurement provided by the thickness metrology tool 150. The thickness measurement may also be used as feedback to adjust the controller gain of Equation 1 used by the automatic process controller 130 to determine the thickness of the oxide layer 260. The feedback may be provided periodically, for every lot, or for every wafer 105, as desired.

Alternatively, the control equations for the trench fill tool 140 may be configured so as to result in an essentially constant polish time requirement for the polisher 160. In such a case, the operating recipe of the polisher 160 would remain essentially constant.

A second thickness metrology tool 170 may be used to measure the post-polish thickness of the silicon dioxide layer 260 to provide feedback to the automatic process controller 130 to adjust the polish control equations used to adapt the polish operating recipe for varying thicknesses of the silicon dioxide layer 260.

Table 1 below illustrates exemplary operating recipe parameters for the trench fill tool 140 and the polisher 160 for varying trench depth measurements. In the illustrated example, the nominal layer thickness used in Equation 1 is assumed to be 5000 Angstroms, the target deposition rate used in Equation 2 is assumed to be 50 Angstroms per minute, and the polish rate used in Equation 3 is assumed to be 100 Angstroms per second. Of course, these parameters are merely illustrative and not intended to limit the application of the present invention.

TABLE 1

| Trench Depth (Ang) | Desired Field Oxide Thickness (Ang) | Required Deposition Time (Min) | Required Polish Time (Sec) |
| --- | --- | --- | --- |
| 2800 | 4900 | 98 | 49 |
| 2850 | 4925 | 98.5 | 49.25 |
| 2900 | 4950 | 99 | 49.5 |
| 2950 | 4975 | 99.5 | 49.75 |
| 3000 | 5000 | 100 | 50 |
| 3050 | 5025 | 100.5 | 50.25 |
| 3100 | 5050 | 101 | 50.5 |
| 3150 | 5075 | 101.5 | 50.75 |
| 3200 | 5100 | 102 | 51 |

Figure 5:
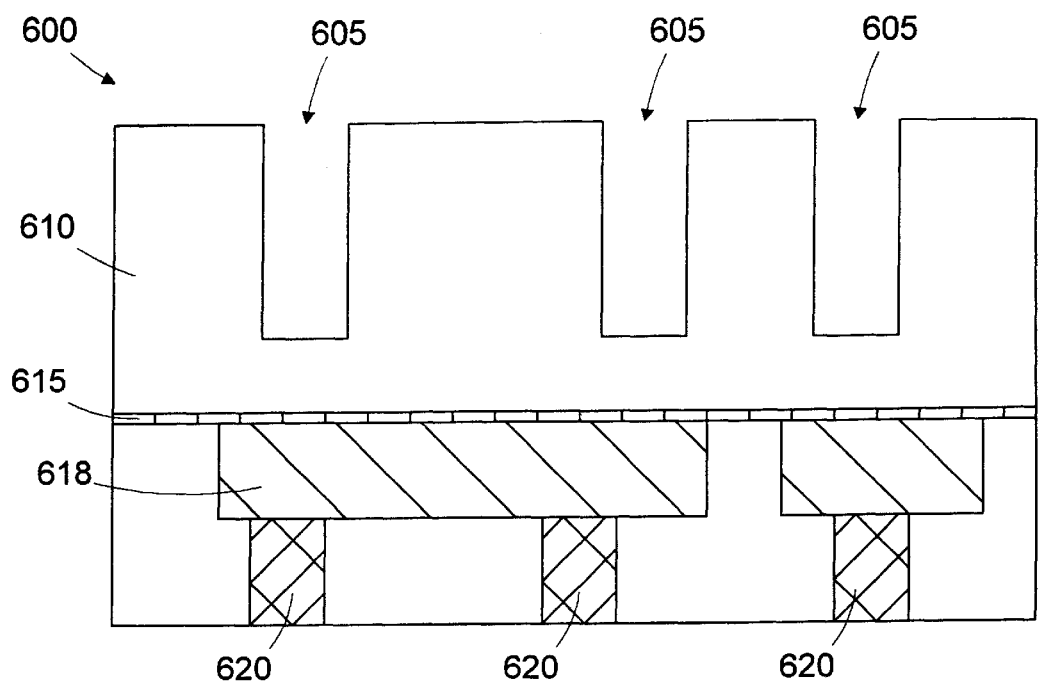
FIG. 5 is a cross-section view of a semiconductor device after partial depth vias have been formed in an insulating layer.
Figure 6:
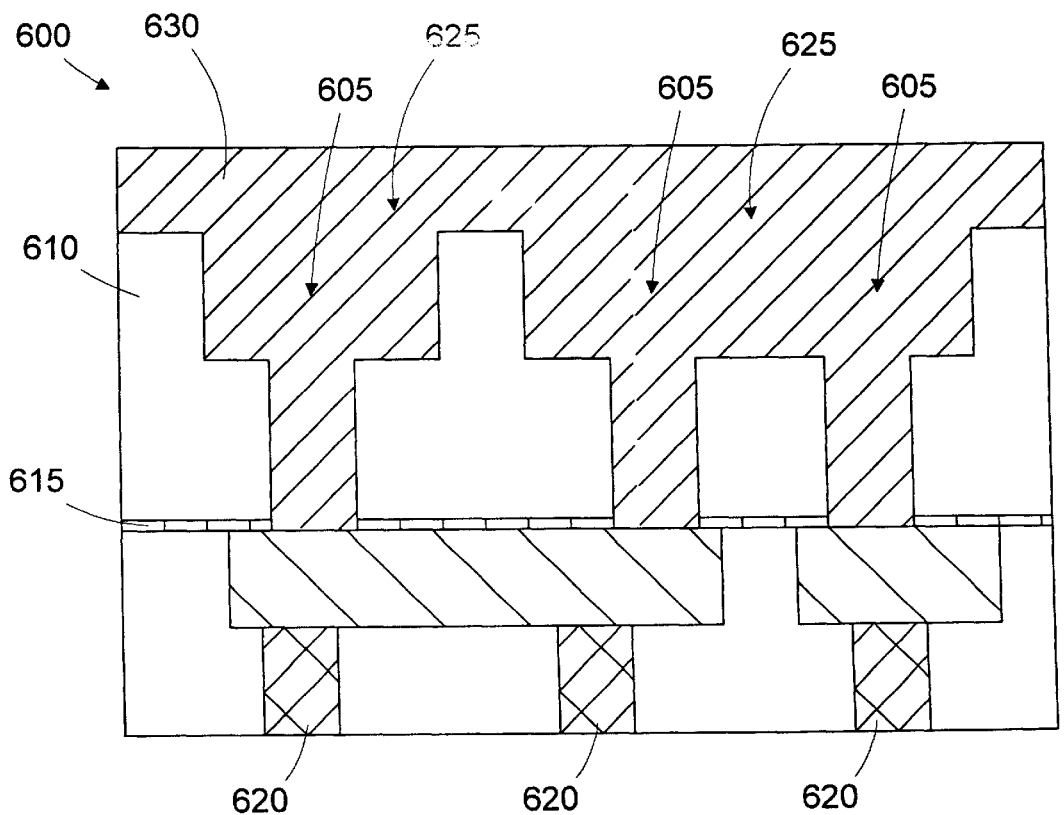
FIG. 6 is a cross-section view of the semiconductor device of FIG. 6 after a trench has been formed in the insulating layer proximate the vias and the trench and vias have been filled with a conductive metal.

Turning to FIGS. 5 and 6, the invention is described as it may be implemented using a metal process. FIG. 5 is a cross-section view of a semiconductor device 600. Partial depth vias 605 have been formed in an insulating layer 610 above a cap layer 615. In the illustrated embodiment, the cap layer 615 is a silicon nitride cap layer. A conductive layer 618 (e.g., copper) is coupled through contacts 620 to underlying devices (not shown), such as transistors.

As shown in FIG. 6, trenches 625 are subsequently formed in the insulating layer 610 proximate the vias 605. Etching of the trenches 625 serves to deepen the vias 605, resulting in the vias 605 contacting the conductive layer 618 after removal of the cap layer 615 at the bottom of the vias 605. The trenches 625 are formed by the trench etch tool 110 of FIG. 1, and the depth of the trenches 625 is subsequently measured by the trench depth metrology tool 120 (e.g., using an Applied Materials OPAL 7830i). Based on the trench depth measurement, in a manner similar to that described above, another conductive layer 630 such as copper, is formed to fill the trenches 625 and vias 605. The conductive layer 630 may be formed by deposition or electroplating, for example.

The recipe of the trench fill tool 140 is adjusted by the automatic process controller 130 based on the trench depth measurements. Recipe parameters, such as the deposition time, plating time, or plating waveform (e.g., DC, variable step, reverse pulse) may be varied by the automatic process controller 130 to affect the depth of the conductive layer 630 formed. Exemplary plating systems are a Novellus SABRE or an Applied Materials Electra. The thickness of the conductive layer 630 may be measured by the thickness metrology tool 150 (e.g., a Rudolph Technologies Metapulse 200) for feedback to the automatic process controller 130 control algorithm of for feed forward to the polisher 160. The thickness metrology tool 170 (e.g., a Tencor P-20) may be used after the polishing for algorithm adaptation.

Figure 7:
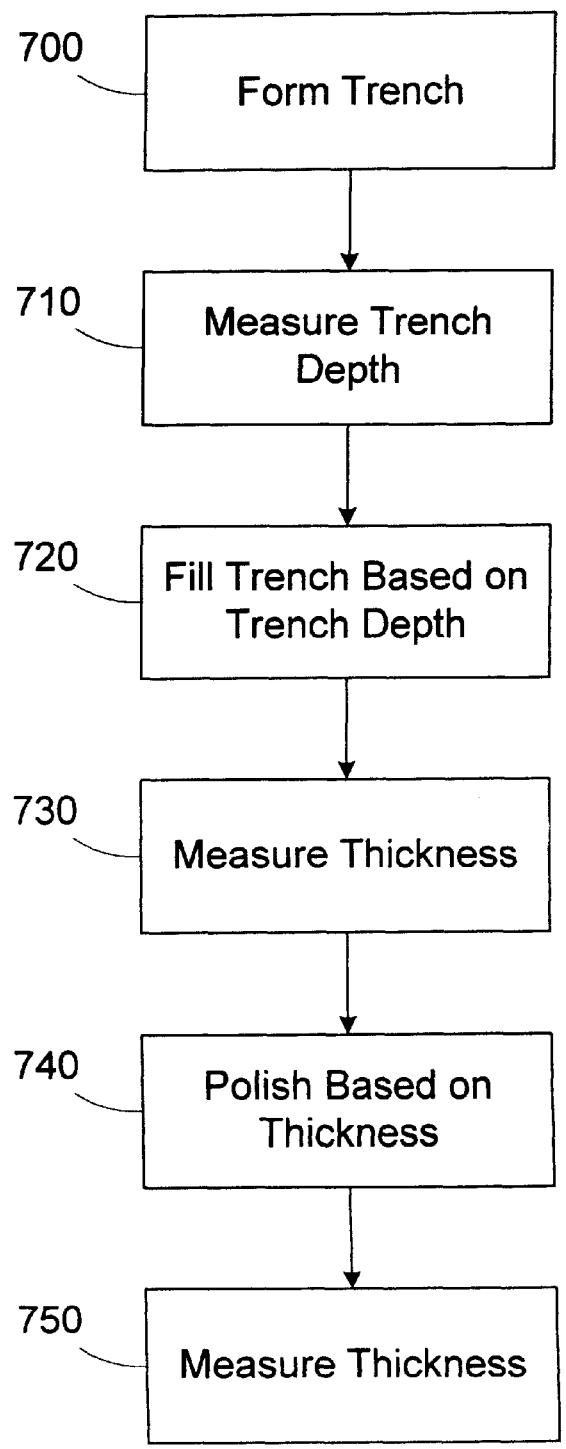
FIG. 7 is a simplified flow diagram of a method for filling a trench in accordance with the present invention.

Turning now to FIG. 7, a simplified flow diagram of a method for filling a trench is provided. As stated above, the teachings herein may be applied to the formation of an isolation structure (i.e., oxide in substrate trench) or to the formation of a conductive feature (i.e., metal in an oxide trench). In block 700, a trench is formed in a base layer by an anisotropic etch process suitable for the base layer. The trench depth is measured in block 710, and the trench is filled in block 720. The thickness of the layer used to fill the trench is based on the measured trench depth, as described above. The layer may be deposited, electroplated, or grown, depending on the particular material selected for filling the trench.

Optionally, the thickness is measured in block 730 to provide feedback information to the trench filling process of block 720 and to provide feed-forward information to the polishing performed in block 740. Again, the polishing may be performed based on the target trench depth used to fill the trench in block 320 in lieu of taking additional measurements in block 730. The post-polish thickness of the fill layer may again be measured in block 750 to provide feedback to the polish process of block 740.

Adaptively changing the operating recipes of the trench fill tool 140 and/or the polisher 160 as described above allows normal variations in the trench depth to be accounted for in subsequent processing steps. Such an adaptive approach reduces the propensity for defect production and reduces the processing time by negating the need to deposit and polish for the worst case trench depth, both of which increase the efficiency of the processing line 100.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A processing line, comprising:
   a trench etch tool adapted to form a trench in a first layer on a wafer;
   a first metrology tool adapted to measure the depth of the trench;
   a trench fill tool adapted to form a second layer over the first layer based on an operating recipe; and
   an automatic process controller adapted to determine a target thickness based on the depth of the trench and modify the operating recipe of the trench fill tool based on the target thickness.

2. The processing line of claim 1, further comprising a polisher adapted to remove at least a portion of the second layer extending beyond the trench based on an operating recipe.

3. The processing line of claim 2, wherein the automatic process controller is adapted to determine a polishing parameter based on the target thickness of the second layer and modify the operating recipe of the polisher based on the polishing parameter.

4. The processing line of claim 2, further comprising a second metrology tool adapted to measure a thickness of the second layer, wherein the automatic process controller is adapted to determine a polishing parameter based on the measured thickness of the second layer and modify the operating recipe of the polisher based on the polishing parameter.

5. The processing line of claim 4, further a third metrology tool adapted to measuring a post-polish thickness of second layer.

6. The processing line of claim 5, wherein the automatic process controller is adapted to adjust the polishing parameter based on the post-polish thickness.

7. The processing line of claim 1, wherein the first layer comprises a semiconductive substrate layer, and the second layer comprises an insulative layer.

8. The processing line of claim 7, wherein the insulative layer comprises at least one of silicon dioxide and silicon nitride.

9. The processing line of claim 1, wherein the first layer comprises an insulative layer, and the second layer comprises a conductive layer.

10. The processing line of claim 9, wherein the conductive layer comprises at least one of copper, aluminum, aluminum alloy, titanium, tantalum, titanium nitride, tantalum nitride, and tungsten.

11. A processing line, comprising:
 means for forming a trench in a first layer formed on a wafer;
 means for measuring a depth of the trench;
 means for determining a target thickness based on the depth of the trench; and
 means for forming a second layer of the target thickness over the trench.

* * * * *